(12) United States Patent
Muhammad et al.

(10) Patent No.: US 8,581,760 B2
(45) Date of Patent: Nov. 12, 2013

(54) DIGITAL TO ANALOG CONVERTER

(75) Inventors: Khurram Muhammad, Garland, TX (US); Tajinder Manku, Waterloo (CA); Semyon Lebedev, Ottawa (CA)

(73) Assignee: BlackBerry Limited, Waterloo (CA)

( * ) Notice: Subject to any disclaimer, the term of this patent is extended or adjusted under 35 U.S.C. 154(b) by 86 days.

(21) Appl. No.: 13/251,935

(22) Filed: Oct. 3, 2011

(65) Prior Publication Data
US 2013/0082853 A1     Apr. 4, 2013

(51) Int. Cl.
    *H03M 1/12*     (2006.01)
(52) U.S. Cl.
    USPC ........... 341/118; 323/315; 323/316; 323/213; 345/76; 345/89; 374/1; 374/3; 341/144; 341/140; 341/138
(58) Field of Classification Search
    USPC .................. 341/118–150; 323/315, 316, 312; 345/76, 89; 374/1, 3, 208
    See application file for complete search history.

(56) References Cited

U.S. PATENT DOCUMENTS

| | | | | |
|---|---|---|---|---|
| 6,603,417 B2 * | 8/2003 | Greig | ............................. | 341/136 |
| 6,768,439 B2 * | 7/2004 | Sun | ................................ | 341/144 |
| 6,778,115 B2 * | 8/2004 | Eloranta | ........................ | 341/144 |
| 6,975,132 B2 * | 12/2005 | Groen et al. | ..................... | 326/27 |
| 7,019,677 B1 | 3/2006 | Soman | | |
| 7,064,696 B2 * | 6/2006 | Ohkubo et al. | ................ | 341/136 |
| 7,227,375 B2 * | 6/2007 | Groen et al. | ..................... | 326/27 |
| 7,292,172 B2 * | 11/2007 | Matsumoto et al. | ........... | 341/144 |
| 7,423,570 B2 * | 9/2008 | Asayama et al. | .............. | 341/144 |
| 7,909,504 B2 * | 3/2011 | Sjogren et al. | ..................... | 374/1 |
| 7,948,415 B2 * | 5/2011 | Asayama et al. | .............. | 341/144 |
| 8,035,541 B2 * | 10/2011 | Onizuka et al. | ................ | 341/139 |
| 8,366,315 B2 * | 2/2013 | Sjogren et al. | ..................... | 374/1 |

OTHER PUBLICATIONS

Partial Search report mailed Feb. 29, 2012; in corresponding application No. 11183730.8.
Yonghua Cong et al. Switching Sequence Optimization for Gradient Error compensation in Thermometer-Decoded DAC Arrays, IEEE Transactions on circuits and systems II. Analog and digitalsignal processing/ISSN 1057-7130 VN 8090B, Institute of Electrical and Electronics Engineers Inc, 345 East 47 Street, NewYork, N.Y. 10017, USA, vol. 47, No. 7, Jul. 1, 2000, XP011013249, ISSN:1057-7130 Sections I, III, V.A, V.B.
Shi, Chunlei, et al. High-Resulution DAC Design Techniques. 20110 pp. 91-103 http://site.ebrary.com/lib/oculottawa/Doc?id=10067714 &ppg=110.
David Jarman; Intersil—A Brief Introduction to Sigma Delta Conversion. 1999, pp. 1-7.

* cited by examiner

*Primary Examiner* — Lam T Mai
(74) *Attorney, Agent, or Firm* — Novak Druce Connolly Bove + Quigg LLP

(57) ABSTRACT

A digital-to-analog converter is disclosed. The converter includes a gradient correction module that generates a correction term based on a model of gradient error. The correction term is then applied to the signal path in the digital domain or applied to the output of the digital-to-analog converter in the analog domain. The model used to generate the correction term is based on a vertical gradient error in the array of current source elements, which may be modelled and calibrated using a second-order polynomial. Further, a digital-to-analog converter having a Nyquist DAC and an oversampled DAC is disclosed. When the oversampled DAC is enabled, the resolution of the Nyquist DAC may be increased while slowing the conversion rate.

19 Claims, 6 Drawing Sheets

DIGITAL TO ANALOG CONVERTER

TECHNICAL FIELD

The present disclosure relates to a digital to analog converter and, in particular, to a digital to analog converter having a corrective term for gradient error.

BACKGROUND

Digital to analog converters (DAC) are commonly used analog blocks, which play an important role of converting a value in the digital domain to a value in the analog domain. Generally, DACs can be characterized into two groups. The first group includes DACs that operate at Nyquist rate (hereinafter referred to as "Nyquist DACs"), which is twice the maximum input signal frequency, allowing the input signal to be recovered without distortion. The second group of DACs include DACs that operate at a sampling rate higher than the Nyquist rate (hereinafter referred to as "oversampled DACs"). Oversampled DACs can achieve higher resolution without increasing complexity; however, this increased resolution comes at decreased conversion rate. This is because a more precise value is generated through the process of averaging over time. As an example, 0.5 LSB can be produced by putting out a 1 followed by a zero which averages to 0.5 over two time steps. However, the added resolution in the example is achieved by trading time and the cost is that the DAC can only provide this extra resolution to input signals with half the Nyquist rate.

A common implementation of DAC uses an array of current sources, which are selectively turned on to create an analog output proportional to the magnitude of the digital value. Some exemplary implementations of such DACs include current-steering DACs, switched-capacitor DACs and resistor-string DACs. However, due to practical limitations (e.g. manufacturing), systematic errors are introduced into the conversion. One example of such systematic errors is gradient error created by inconsistencies in the silicon wafer, including thermal, doping and oxide thickness gradients. This can cause component properties to vary along a particular direction. Since DACs are built through arraying identical devices in two dimensions, the output produced by different components exhibit the same gradient in their current/voltage output. The result is that the output of the array of current sources is non-linear, leading to Integral Non-Linearity (INL) and Differential Non-Linearity (DNL).

There are known ways to cope with INL and DNL. One commonly used technique is to randomize the selection of the current sources to improve the INL and DNL. Other techniques include reordering the selection of the current sources in an effort to cancel out the effects of gradient errors, thus improving INL and DNL, and using a separate calibration DAC that uses a look-up table to produce a compensating current that cancels out the systematic effects of INL and DNL. However, these known techniques require an additional DAC which must now produce the exact compensation which is somehow characterized over a large number of DACs, averaged and represented as look-up table (LUT) entries. These entries apply to all the DACs over process and temperature corners and produce limited compensation ability. The compensating DAC and the associated LUT also take up space and current consumption and provide compensation ability to the extent of applicability of the calibration values.

Another widely used approach provides the compensation by alternating the selection of next current cell elements such that the gradient is cancelled by inherent selection of successive devices. As input is increased the gradient is cancelled by choosing next addressed element to be on the opposite side of the gradient. However, this method requires the knowledge of gradient a priori in order to device a scheme of switching selection. This is unfortunate if the expected gradient turns out to be different than the actual gradient as the scheme will no longer provide the intended correction. Also, if the gradient changes from one lot to another or from one fabrication plant to another, there is no efficient way of determining a compensation scheme that would work across all the devices since the solution is hard-wired.

Accordingly, a DAC that addresses at least some of these disadvantages is highly desirable.

BRIEF DESCRIPTION OF THE DRAWINGS

Further features and advantages of the present technology will become apparent from the following detailed description, taken in combination with the appended drawings, in which.

It will be noted that throughout the appended drawings, like features are identified by like reference numerals.

DETAILED DESCRIPTION

Figure 1:
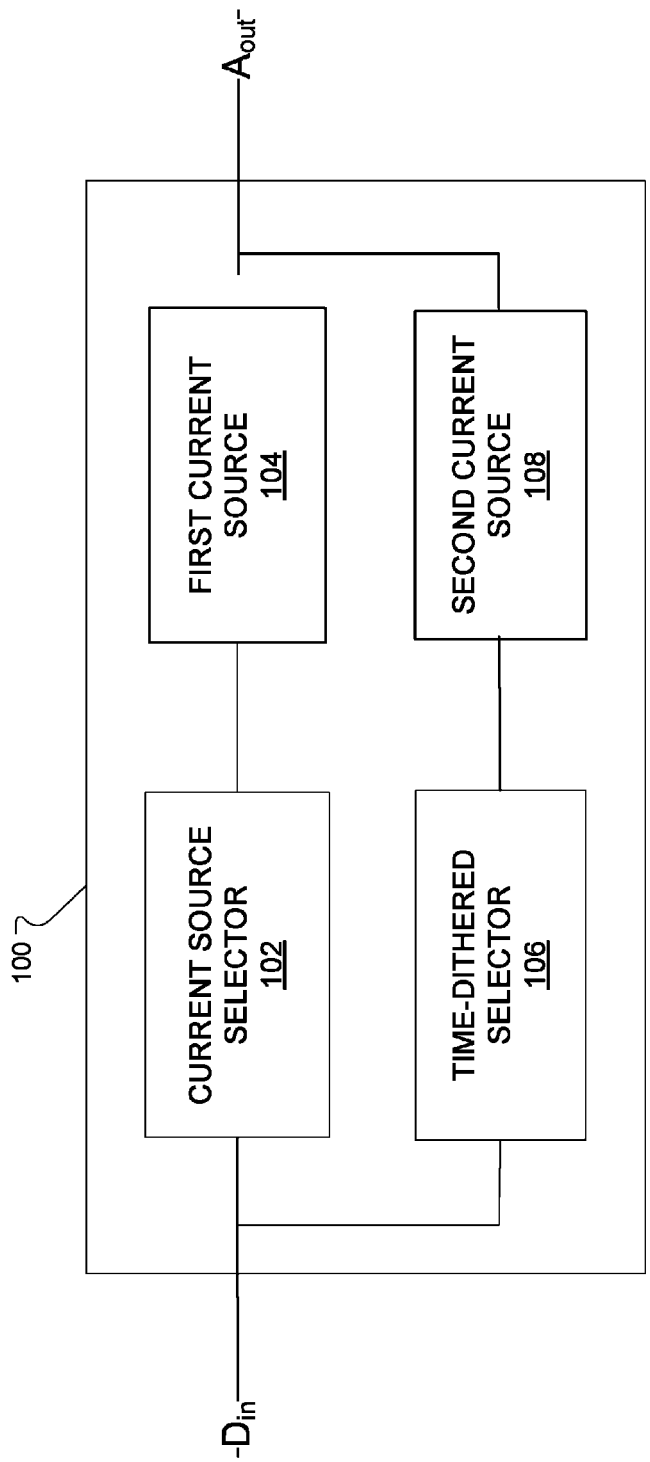
FIG. 1 illustrates a block diagram for a hybrid DAC according to an embodiment of the present technology.

Embodiments are described below, by way of example only, with reference to FIGS. 1-6.

In the present disclosure, a DAC that corrects systematic errors arising from vertical gradient or horizontal gradient or both is disclosed. The DAC includes a gradient correction module that generates a correction term based on the systematic error that is modelled using, for example, a second-order polynomial. The correction term is then applied to the signal path in the digital domain or applied to the output of the digital-to-analog converter in the analog domain. Furthermore, a digital-to-analog converter having a Nyquist DAC and an oversampled DAC is disclosed. When the oversampled DAC is enabled, the resolution of the Nyquist DAC may be increased while slowing the conversion rate.

In this specification and the appended claims, the singular forms "a," "an," and "the" include plural references unless the context clearly dictates otherwise. Unless defined otherwise, all technical and scientific terms used herein have the same meaning as commonly understood to one of ordinary skill in the art to which this disclosure belongs.

It will be further understood that the terms "comprises" or "comprising", or both when used in this specification, specify the presence of stated features, integers, steps, operations, elements, and/or components, but do not preclude the presence or addition of one or more other features, integers, steps, operations, elements, components, and/or groups thereof.

In accordance with one embodiment of the present disclosure, there is provided a digital-to-analog converter (DAC). The DAC comprises a data input for receiving a digital value; a current source comprising an array of current source elements, the array of current source elements for producing an analog value; a current source selector for selectively activating at least one of the current source elements in the current source based on the digital value; a gradient correction module for generating a correction term based on a model of gradient error, the correction term being applied to the data input or being combined with the analog value produced by the current source; and a data output for outputting the analog value corresponding to the digital value.

In some embodiments, the model of the gradient error is based on a vertical gradient error.

In some embodiments, the vertical gradient error is modelled using a second-order polynomial.

In some embodiments, the current source selector comprises a binary coded part and a thermometer coded part.

In some embodiments, the model of the gradient error is a second-order polynomial based on a vertical gradient error, the second-order polynomial expressed as $I_{Off}=c_2(d_{in}-d_{mid})^2+c_1(d_{in}-d_{mid})$, wherein $d_{in}$ represents the digital input into the thermometer coded part, $d_{mid}$ represents the digital input corresponding to the row in the thermometer coded part of the array around which the vertical gradient error is centered and $I_{Off}$ represents the deviation of the data output from an ideal output.

In some embodiments, the correction term is the value of $d_{corr}$ as defined by $d_{corr}+c_2((d_{in}+d_{corr})-d_{mid})^2+c_1((d_{in}+d_{corr})-d_{mid})=0$.

In some embodiments, the correction term is $d_{corr}=-c_2(d_{in}-d_{mid})^2-c_1(d_{in}-d_{mid})$.

In some embodiments, the current source comprises an array of switched current cells, switched-capacitor current source or resistor string current source, or a combination thereof.

In some embodiments, the current source selector comprises a fully binary coded circuit.

In some embodiments, the DAC further comprises a second current source comprising at least one current source element, the at least one current source element for producing a time-dithered output that averages to an analog value less than least-significant bit (LSB) size of the DAC; and a time-dithered selector for selectively activating the at least one current source element in the second current source to produce the time-dithered output when enabled.

In some embodiments, the time-dithered selector generates a time-dithered sequence using a sigma-delta modulator, or a pulse-width modulator, or both.

In accordance with another embodiment of the present disclosure, there is provided a method for providing analog values comprising: receiving a digital data input; converting the digital data input to an analog output; applying a test codeword to the digital data input; outputting the analog value corresponding to the digital value; measuring the analog output based on the applied test codeword; and generating a correction term based on a model of gradient error, the correction term being applied to the digital data input or being combined with the analog output.

In some embodiments, the generating a correction term comprises finding a best-fit gradient model polynomial for the measured analog output.

In accordance with another embodiment of the present disclosure, there is provided a digital-to-analog converter (DAC). The DAC comprises a data input for receiving a digital value; and a Nyquist DAC having: a first current source comprising an array of current source elements, the array of current source elements for producing an analog value; and current source selector for selectively activating at least one of the current source elements in the first current source based on the digital value. The DAC further comprises an oversampled DAC including: a second current source comprising at least one current source element, the at least one current source element for producing a time-dithered output that averages to an analog value less than least-significant bit (LSB) size of the Nyquist DAC; and a time-dithered selector for selectively activating the at least one current source element in the second current source to produce the time-dithered output when the oversampled DAC is enabled. The DAC further comprises a data output for outputting an analog value corresponding to the digital value by combining the analog value from the Nyquist DAC and the analog value from the oversampled DAC when enabled.

In some embodiments, the first current source and the second current source are arranged into an M×N array of current source elements, wherein M is the number of rows in the array and N is the number of columns in the array.

In some embodiments, the time-dithered selector generates a time-dithered sequence using a sigma-delta modulator, or a pulse-width modulator, or both.

In some embodiments, the first current source comprises an array of switched current cells, switched-capacitor current source or resistor string current source, or a combination thereof.

In some embodiments, the second current source comprises an array of switched current cells, switched-capacitor current source or resistor string current source, or a combination thereof.

In some embodiments, the DAC further comprises a second Nyquist DAC for generating a DC offset compensation, the DC offset compensation being used to compensate for a DC offset present in the Nyquist DAC.

Figure 2:
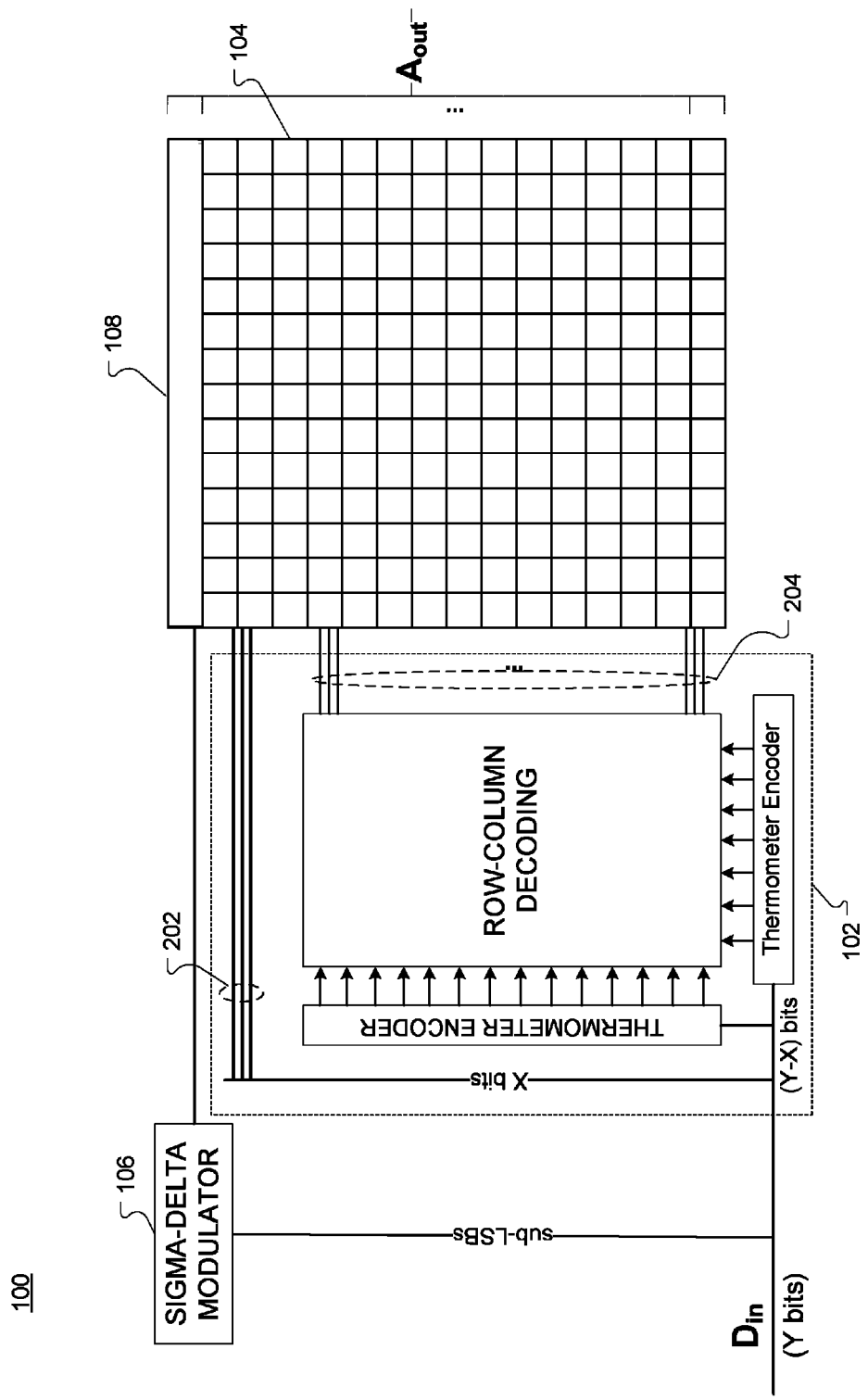
FIG. 2 illustrates an exemplary implementation of the hybrid DAC shown in FIG. 1.

The basic structure of a hybrid DAC 100, according to an embodiment of the present technology, is shown in FIG. 1. The hybrid DAC 100 includes a data input for receiving the digital value ($D_{in}$) and an analog output for outputting the analog value ($A_{out}$). To convert the digital value to the analog value, the hybrid DAC 100 includes a current source selector 102 to selectively activate the array of current source elements in the first current source 104. The current source selector 102 and the first current source 104, along with the data input and analog output, operate at the Nyquist rate and thus form a Nyquist DAC. The principle upon which current steering DAC operates is to steer the current from the positive side to the negative side so as to increment or decrement the selected value from the total value. In addition to the Nyquist DAC, the hybrid DAC 100 includes an oversampled DAC that can be activated to increase the resolution of the Nyquist DAC when necessary. The oversampled DAC includes a time-dithered selector 106 and a second current source 108, which includes at least one current source element for producing a time-dithered output based on the selection by the time-dithered selector 106. While the first and second current sources 104, 108 are shown as separate elements, it will be understood that they may be formed within a single current cell array as shown in FIG. 2. That is, second current source 108 can be added to the main array at any row location, for example but not limited to, as an additional row adjacent to the first current source 104. Moreover, the relational terms first and second are used solely to distinguish one from another entity without necessarily requiring or implying order. The time-dithered output averages to a value that is less than the least-significant bit (LSB) of the Nyquist DAC. For example, the time-dithered output may be 10101010 to produce an average value of 0.5 over eight sampling cycles, when the LSB of the Nyquist DAC is 1. In this example, the smallest value 10000000 will produce 0.125 LSB output, hence increasing resolution to beyond 1 LSB at the cost of slower conversion time (i.e. the input must be held for eight cycles). The time-dithered output is combined with the output from the Nyquist DAC to produce the converted analog value. Thus, when enabled, the oversampled DAC increases the resolution of the DAC while increasing the conversion time. When the oversampled DAC is disabled, conversion is performed at the Nyquist rate. The time-dithered signal may be produced, for example but not limited to, using PWM signal or by a noise shaping sigma-delta modulator.

Turning to FIG. 2, an exemplary implementation of the hybrid DAC 100 is shown. In this implementation, the current source selector 102 is implemented as a segmented selection circuit comprising a binary coded section 202 and a thermometer coded section 204. The binary coded section 202 receives the first X bits of $D_{in}$ as input and the thermometer coded section 204 receives the remaining bits (Y-X) of $D_{in}$ as input. For example, where $D_{in}$ is a 12-bit digital value, the binary coded section 202 may receive the first 5 bits of $D_{in}$ while the thermometer coded section 204 may receive the remaining 7 bits. The decoded outputs of the binary coded section 202 and thermometer coded section 204 selectively turn on the current source elements in the first current source 104 to generate the corresponding analog current value of the digital input. In FIG. 2, the first and second current sources 104, 108 (hereinafter collectively referred to as current source 104, 108) are stacked to produce an M×N array of current sources elements. This allows the current source 104, 108 to have a symmetric layout.

The use of a segmented selection circuit as the current source selector has many advantages, including ease of matching requirements between differently weighted current sources and elimination of other switching problems. Each line in the binary coded section 202 may be hardcoded to drive one or more current source elements in one row of the array of current elements in the current source 104. For example, if the binary coded section 202 receives the first 5 bits of $D_{in}$, $bit_0$ may be connected to 1 current source element in $row_1$, $bit_1$ may be connected to 2 current source elements in $row_2$, $bit_2$ may be connected to 4 current source elements in $row_3$, $bit_3$ may be connected to 8 current source elements in $row_4$ and $bit_4$ may be connected to 16 current source elements in $row_5$. The remaining current source elements may be left as dummy current source elements. Again, this achieves symmetry in the layout of the current source elements and relaxes the matching requirements. In another implementation, the current source element may be weighted according to the binary value.

As for the thermometer coded section 204, it converts the (Y-X) input bits into a $2^{(Y-X)}-1$ bits output, with each bit driving a current source element in the first current source 104. Referring to a thermometer coded section receiving 7 bits, Table 1 below illustrates the number of current source elements in the first current source 104 that are turned on for each of the corresponding digital input.

TABLE 1

Thermometer encoding

| $D_{in}$ | Logic | # of Current Source Elements Required |
|---|---|---|
| 0000000 | 0 | 0 |
| 0000001 | $2^0$ | 1 |
| 0000010 | $2^1$ | 2 |
| 0000011 | $2^1 + 2^0$ | 3 |

TABLE 1-continued

Thermometer encoding

| $D_{in}$ | Logic | # of Current Source Elements Required |
|---|---|---|
| 0000100 | $2^2$ | 4 |
| 0000101 | $2^2 + 2^0$ | 5 |
| ... | ... | ... |
| 1000000 | $2^6$ | 64 |
| ... | ... | ... |
| 1111111 | $2^6 + 2^5 + 2^4 + 2^3 + 2^2 + 2^1 + 2^0$ | 127 |

So, if each current source element in the current source produces an ideal output of 1 mA, the output can be proportionally changed depending on the digital input $D_{in}$. This DAC would then have a resolution of 1 mA/LSB.

Hybrid DAC 100 further includes an oversampled DAC. In the implementation shown in FIG. 2, the time-dithered selector 106 is implemented using a sigma-delta modulator 106 driving the second current source 108. In this exemplary implementation, the sigma-delta modulator 106 is a 1-bit modulator and thus, the output of the sigma-delta modulator 106 is connected to one row of the array of current source elements in the current source 104, 108. In other words, the second current source 108 is configured to be a 1×N current source elements, stacked with the first current source 104 to produce a M×N array of current source elements. It will be understood that, depending on the sigma-delta modulator 106 or any other time-dithered output generator, such as a pulse-width modulator, one or more rows of the current source 104, 108 may be operated. In an alternative implementation, a multi-bit sigma-delta modulator may also drive multiple unit cells in one of the rows of current source 104, 108 as shown in FIG. 2. When the sigma-delta modulator 106 is enabled, it creates a time-dithered output that, when averaged, creates a value that is smaller than the LSB (i.e. sub-LSB). Thus, by producing a sub-LSB value, the hybrid DAC 100 is able to increase the resolution of the Nyquist DAC. An example will now be described.

Table 2 illustrates an exemplary output of the Nyquist DAC (i.e. current source selector 102 and first current source 104), which for each digital value generates a corresponding analog value. As discussed in the example in this disclosure, assuming that LSB of this Nyquist DAC translates to 1 mA. However, in order to increase the resolution and create an output, for example, of 0.5 mA, the sigma-delta modulator 106 is activated to output 101010 over 6 sampling cycles. As illustrated in Table 3, the output from the combination of the sigma-delta modulator 106 and the Nyquist DAC produces an average value of 0.5 mA. Also note that the conversion rate of the hybrid DAC would operate at ⅙ the conversation rate of the Nyquist DAC. In other words, conversion time is traded-off to increase the resolution of the hybrid DAC 100. While the sigma-delta modulator 106 was shown with a 1-bit output, it will be understood that the sigma-delta modulator 106 may be a multi-bit output, which may increase the conversion rate.

TABLE 2

Sample DAC output without Sigma-Delta Modulator

| Digital Value | Analog Value |
|---|---|
| 000 | 0 mA |
| 001 | 1 mA |

TABLE 2-continued

Sample DAC output without Sigma-Delta Modulator

| Digital Value | Analog Value |
|---|---|
| 010 | 2 mA |
| 011 | 3 mA |

TABLE 3

DAC output with Sigma-Delta Modulator

| Digital Value | Sub-LSB | Analog Value | Average Value |
|---|---|---|---|
| 000 | 1 | 0 mA + 1 mA = 1 mA | $\frac{3 \text{ mA}}{6} = 0.5 \text{ mA}$ |
| 000 | 0 | 0 mA | |
| 000 | 1 | 0 mA +1 mA = 1 mA | |
| 000 | 0 | 0 mA | |
| 000 | 1 | 0 mA +1 mA = 1 mA | |
| 000 | 0 | 0 mA | |

This hybrid DAC has many applications where a Nyquist DAC at a predetermined resolution is required but, in certain instances, a higher resolution than the predetermined resolution is required. For example, let us consider the design of a single DAC that can operate at high rate with low resolution and lower rate with higher resolution. In the high speed mode, it could be used as an I/Q (in-phase/quadrature) DAC in a transmitter to convert digital I/Q input to analog I/Q waveforms. The analog I/Q waveforms are then fed to analog filters, upconversion mixer and PA (power amplifier) driver to obtain the RF transmitter output. A copy of the same DAC can be used as an Automatic Frequency Control (AFC) DAC to control the frequency of the reference to the PLL (phase-locked loop) of the transmitter/receiver by decoding frequency bursts and determining that the reference frequency needs an adjustment. Such adjustments are not needed frequently, however, the DAC must exhibit much higher resolution (13-bits e.g. compared to 11-bits for TX DACs) in this application. The slower, more accurate DAC can also be used to compensate for TX or RX DC offsets, or for providing ramp to the power amplifier. The advantage of using this scheme is to partition a DAC into a Nyquist part that operates at high frequency and a time-dithered part that provides higher resolution at lower speed of operation. For DAC waveforms that are not needed simultaneously, a single DAC can drive multiple outputs e.g. in a Time Division Duplex communication standard.

In a further embodiment, hybrid DAC 100 in FIG. 1 may have more than one Nyquist DACs or more than one oversampled DACs or any combination thereof to be collocated with independent inputs. Referring to FIG. 2, the current sources of multiple DACs may be placed adjacent to each other in a single structure with multiple control inputs driving them. In this configuration, a hybrid DAC structure can be viewed as multiple independent DACs. Referring to FIG. 2, the current source 104, 108 includes array of current source elements which may be controlled by the different DACs. For example, the first 1 to X rows may belong to a first Nyquist DAC, the next (X+1) to Y rows may belong to a second Nyquist DAC, and the remaining (Y+1) to M rows (X<Y<M) may belong to the sigma-delta DAC. In this implementation, the collocation of the current sources has the advantage of improving gradient and mismatch related errors. Moreover, one of the two Nyquist DAC may be used to apply a DC offset to compensate for the inherent DC offset at the output of the other Nyquist DAC, such that the load shared by the two DACs sees no DC offset. Fine DC offset can be cancelled by adding an additional row of current source element with an independent sigma-delta DAC input to add resolution to the cancelling DC offset (since offsets do not change quickly and oversampling can be used to trade slow response with higher resolution).

Figure 3:
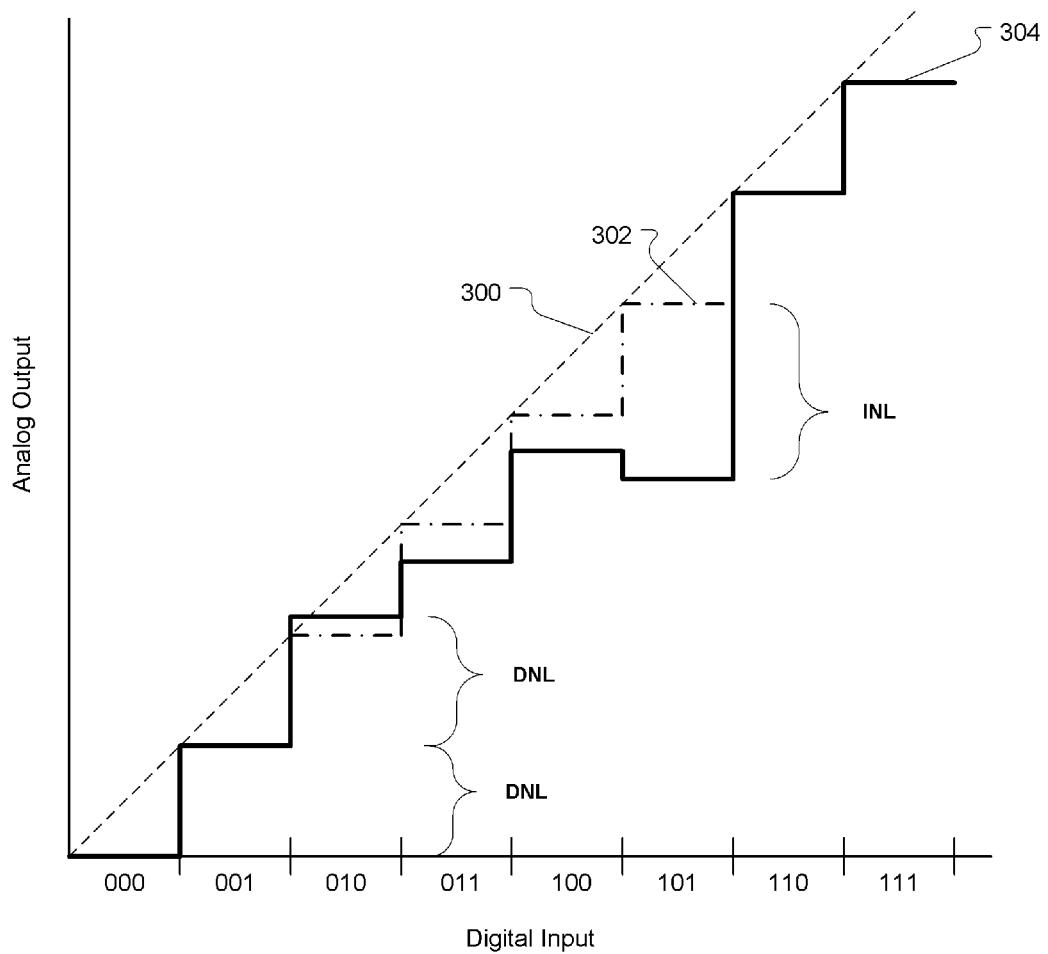
FIG. 3 illustrates an exemplary digital to analog output showing the actual output and the ideal output.

As discussed in the present disclosure, DACs are often implemented using an array of current source elements, which are selectively turned on to create an analog output proportional to the magnitude of the digital value. The array of current source elements may be implemented in a variety of ways including a switched current source (i.e. combination of differential current switch and cascade current source), a switched-capacitor array and/or a resistor string array based voltage DACs. However, due to practical limitations, systematic mismatches occur between at least some of the current source elements in the array. Thus, while the ideal output produces an analog value that is linearly proportional to the digital value, the actual output may be non-linear due to systematic errors (e.g. gradient error). These systematic errors can be measured in terms of Integral Non-Linearity (INL) and Differential Non-Linearity (DNL), an example of which is shown in FIG. 3. DNL refers to the difference between two analog outputs corresponding to adjacent digital inputs and INL refers to the maximum deviation of the actual analog output when compared to the ideal analog output. In FIG. 3, the ideal output is shown as output 302, which follows the linearly proportional line 300 and monotonically increases by the LSB size. However, because of systematic errors, the actual output 304 may deviate from the ideal output 302.

Both active and passive solutions have been proposed to lower INL and DNL. Passive solutions may include measuring the gradient error after fabrication of the current source, and selectively hard-wiring the current source elements to lower INL and DNL. For example, a current source element that is producing an analog value greater than 1 LSB may be paired with a current source element that is producing an analog value less than 1 LSB. Active solutions also similarly reorder the order in which the current source elements in the current source are turned on and off to effectively lower INL and DNL. Other active solutions include randomizing or pseudo-randomizing the selection order to lower INL and DNL.

To better combat INL and DNL without randomization or reordering the selection of the current source elements, the present disclosure determines a correction term based on a gradient model, and applies the correction term in the digital domain (i.e. in the signal path of $D_{in}$) or in the analog domain (i.e. at the analog output). To determine the correction term, a model of the gradient error is created, which simulates the difference between the ideal output and actual output of the current source caused by the gradient in the current source.

Figure 4:
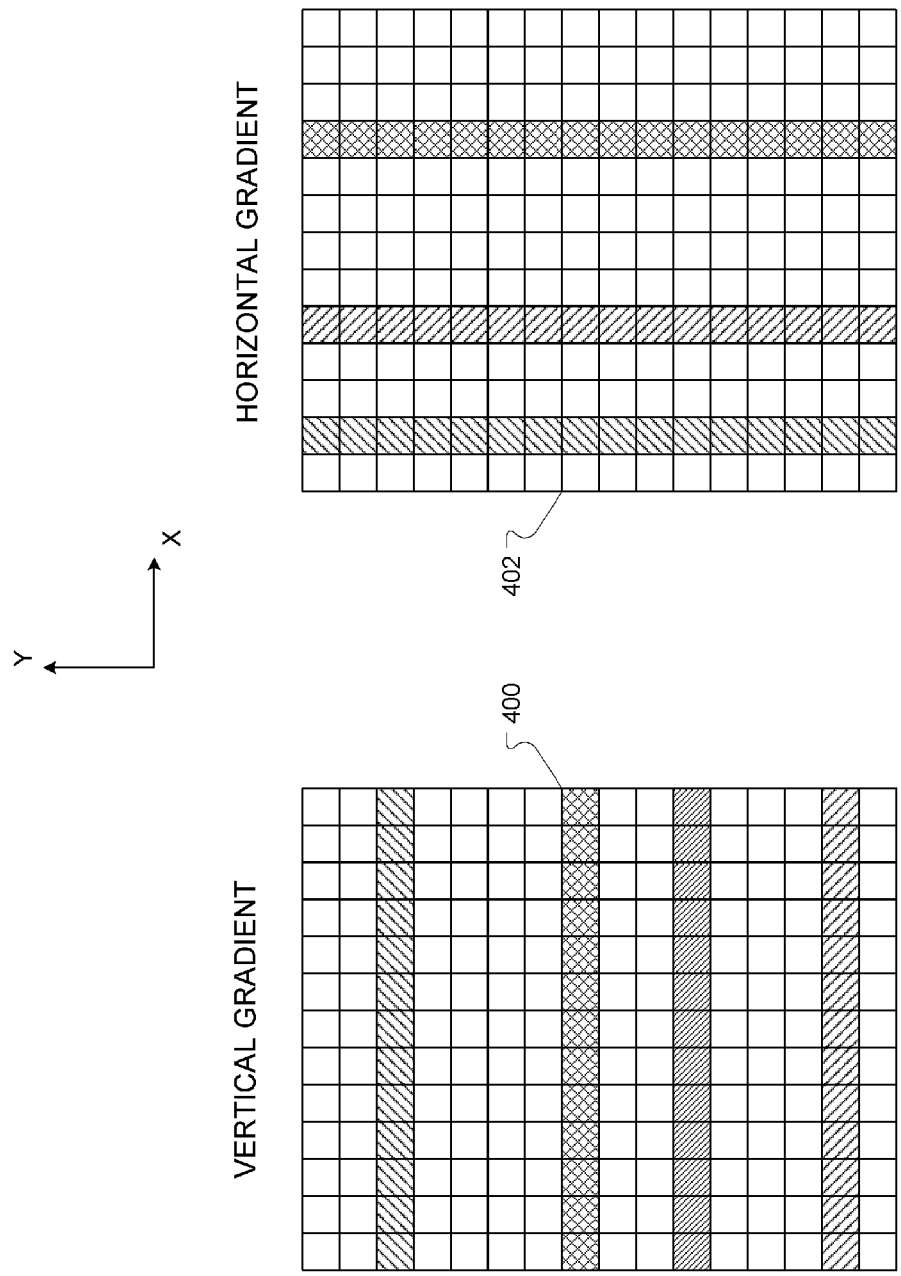
FIG. 4 illustrates exemplary vertical and horizontal gradients in a current source.

Gradient error is an error caused by inconsistencies in the silicon wafer, such as thermal, doping and oxide thickness anomalies created during the manufacturing process. There may also be mechanically induced inconsistencies, for example near the edges of the silicon wafer where a cut was made. Gradients can be characterized as being a vertical gradient (i.e. gradient error between cells in the y-direction) and a horizontal gradient (i.e. gradient error between cells in the x-direction). FIG. 4 shows a visual representation of vertical and horizontal gradient. The M×N array of current source elements in the current sources 400, 402 are shown to have vertical and horizontal gradients as indicated by the shaded areas. As shown, vertical gradients create differences between current source elements in the y-direction. The current value produced by a current source element in one row would be different from another current source element in another row that is affected by the gradient. If a ramp signal is applied at the input to cause selection of increasingly more rows and the difference of the actual output to the ideal output will be referred to as an error waveform, the error waveform will have two components to it: the first caused by systematic gradient and the second due to random mismatches. As disclosed in the present disclosure, the systematic gradient is modelled using a polynomial. The polynomial is then fit into the error waveform to determine the systematic part of the error. In the exemplary embodiment, a second order polynomial is fit to represent the systematic gradient and applied for correction.

By contrast, horizontal gradients create differences between current source elements in the x-direction. However, unlike vertical gradients, all current source elements in the row are equally affected and thus, the output of the thermometer coded part (e.g. 204 in FIG. 2) is not scaled by the error quantity. That is because the horizontal gradient affects all rows the same way in the thermometer coded part. However, horizontal gradient will affect the binary coded part (e.g. 202 in FIG. 2) which uses only a part of a row, as the rest of the current cells in the row may be dummy cells, and can be largely corrected by centering the binary cells around the center of the horizontal array. Alternatively, the horizontal gradient in the binary coded part may be modelled as with the vertical gradient, described below.

To correct for the vertical gradient in the thermometer coded part of the array, a model is created that takes into consideration the vertical gradient in the current source array, which typically consumes more than 99% of the DAC current source area. Generally, the vertical gradient in the current source can be expressed as a second order polynomial: $I_{Off}=c_2(d_{in}-d_{mid})^2+c_1(d_{in}-d_{mid})$, where $d_{in}$ represents the digital input into the thermometer coded part of the DAC, $d_{mid}$ represents the digital input corresponding to the row in the thermometer coded part of the array around which the vertical gradient is centered and $I_{Off}$ represents the deviation of the actual output from the ideal output. While this model takes into consideration the codeword inputted into the thermometer coded part of the DAC (i.e. $d_{in}$), it will be understood that it can be expanded to the entire DAC (thermometer and binary coded part) depending on the implementation of the current source selector. For example, where the current source selector is implemented using a segmented selection circuit, $d_{in}$ may be replaced with the input to the entire DAC. The correcting polynomial for the binary part will compute the distance of the binary row from $d_{mid}$ and apply the polynomial correction.

The calculated $I_{Off}$ can then be added to the input or output to remove the difference between the actual output and the ideal output. However, prior to the calculation, the coefficients $c_1$ and $c_2$, and $d_{mid}$ must be determined through a calibration process. The calibration process involves inputting a series of test code-words into the data input, measuring the output of the DAC based on the series of test code-words, and finding a best-fit gradient model polynomial for the measured output. For example, the test code-words can be a ramp signal. This calibration may be done on a per-DAC basis or for a plurality of DACs. One advantage of this approach is that compensation for the gradient error can be determined after the construction of the DAC, eliminating any guess work or discrepancies between the expected gradient and the actual gradient. While the model is represented using a second-order polynomial, it will be understood that a higher order polynomial may be used to increase accuracy. It will further be understood that, while the described model considers the effects of the vertical gradient, the model may well be configured to consider the horizontal gradient. This can be achieved by revising the model as a two-dimensional model, which takes into consideration the offset of the current source elements in both the x and y direction. The compensation for the horizontal gradient will then be applied to the binary coded part as well as the time dithered bits.

Figure 5:
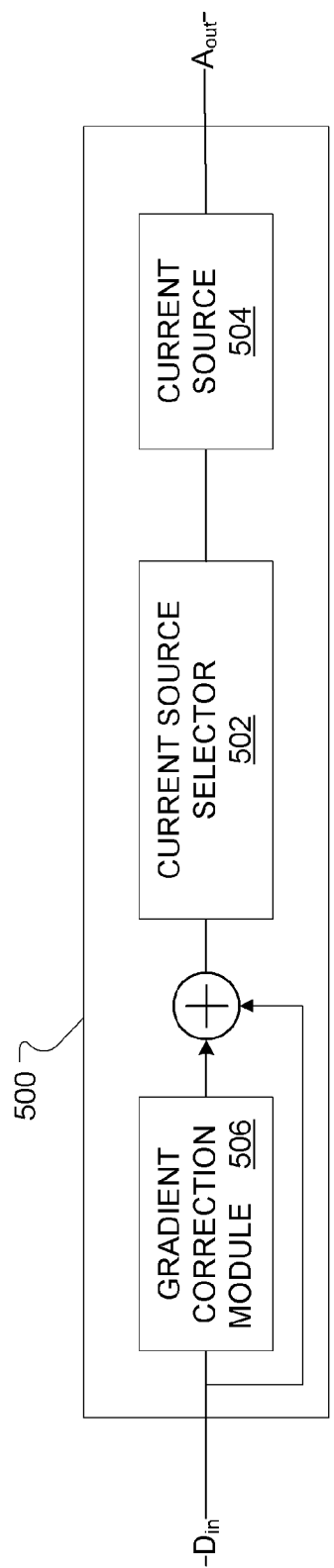
FIG. 5 illustrates a DAC according to another embodiment of the present technology.

Now turning to FIG. 5, a DAC 500 according to another embodiment of the present technology is disclosed. In DAC 500, there is included a current source selector 502, and a current source 504, which may be similarly implemented as current source selector 102 and first current source 104. For example, the current source selector 502 may be a fully binary coded circuit, segmented selection circuit or any other selection circuit suitable to work with a current source. As for the current source 504, it may be, for example, an array of switched current cells, switched-capacitor or resistor string array based voltage source. Furthermore, it will be understood that DAC 500 may also include a time-dithered selector (such as 106 in FIG. 1) and a second current source (such as 108 in FIG. 1), which may be enabled to increase the resolution of the DAC 500 all being driven by the sum of the compensation circuit 506 output and the input (i.e. compensated output of the adder in DAC 500).

In addition, the DAC 500 includes a gradient correction module 506 in the input signal $d_{in}$, which adds a correction term to the input signal $d_{in}$ in the digital domain based on the vertical gradient model. The output of the DAC 500, with the gradient correction module 506 disabled, can be expressed as $I_{Out}=d_{in}+I_{Off}$, which can be expanded out to $I_{Out}=d_{in}+c_2(d_{in}-d_{mid})^2+c_1(d_{in}-d_{mid})$. Thus, in order to cancel out the gradient error, a correction term $d_{corr}$ is applied to the signal path (i.e. $d_{in}+d_{corr}$), and the new output can be expressed as $I_{Out}=(d_{in}+d_{corr})+c_2((d_{in}+d_{corr})-d_{mid})^2+c_1((d_{in}+d_{corr})-d_{mid})$. For the output to equal the ideal output, $d_{corr}+c_2((d_{in}+d_{corr})-d_{mid})^2+c_1((d_{in}+d_{corr})-d_{mid})=0$, which can be solved for $d_{corr}$ to arrive at the compensation codeword to apply to the signal path in the digital domain. Each $d_{corr}$ calculated for $d_{in}$ may be stored in memory and retrieved for subsequent use. In another preferred implementation, value for $d_{corr}$ may be simplified to increase the performance of the DAC 500. In this implementation, $d_{corr}$ is simply equated to $-c_2(d_{in}-d_{mid})^2-c_1(d_{in}-d_{mid})$.

Figure 6:
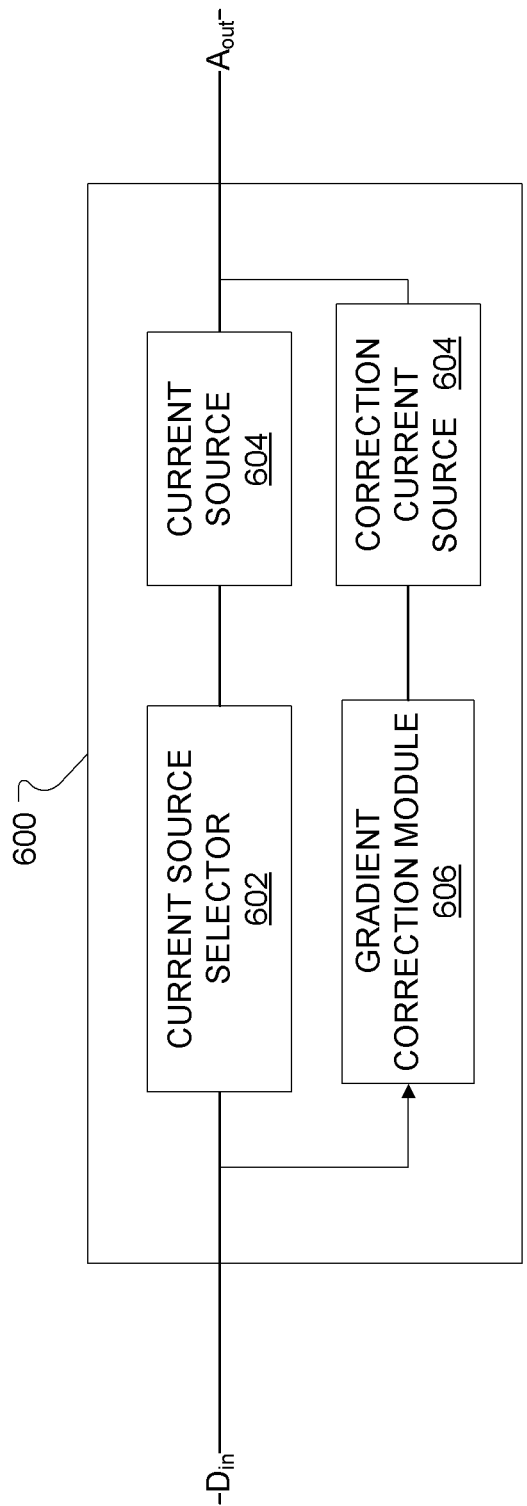
FIG. 6 illustrates a DAC according to a further embodiment of the present technology.

Another implementation of the present technology is shown in FIG. 6 where the output of the gradient correction module 606 is combined with the output of the Nyquist DAC. The correction term determined by the gradient correction module 606 is applied using the correction current source 604, which may comprise at least one current source element to generate the correction term. Since the correction term is applied in the analog domain, the correction term may be expressed as $I_{Off}=c_2(D_{in}-D_{mid})^2+c_1(D_{in}-D_{mid})$. The compensating DAC is collocated with the main DAC and uses some of the rows of the current source 104, 108. In one implementation, in order to generate a more accurate $I_{Off}$, the output of the gradient correction module 606 may use an oversampled clock to generate a time-dithered sequence that averages to the desired value of the correction term. The time-dithered sequence may be generated, for example, using a sigma-delta modulator, or a pulse-width modulator.

The correction term applied to embodiments shown in FIG. 5 and FIG. 6 may span over the entire code-word including the binary and the oversampled DAC. The oversampled DAC may be operated with an independent clock at N×fs, where fs is the clock applied to the Nyquist DAC and N is the oversampling ratio. Hence, the correction term has a higher resolution than the LSB of the Nyquist DAC.

As with the DAC 500 in FIG. 5, the Nyquist DAC in FIG. 6 is comprised of the current source selector 602 and the current source 604, which may be similarly implemented as current source selector 102 and first current source 104. In one implementation, the current source selector 602 may be a fully binary coded circuit. In another implementation, the current source selector 602 may be a segmented selection circuit having a binary coded section and a thermometer coded section. As for the current source 604, it may be, for example, an array of switched current cells, switched-capacitor or resistor string array voltage source. Furthermore, it will be understood that DAC 600 may also include an oversampled DAC comprised of a time-dithered selector (such as 106 in FIG. 1) and a second current source (such as 108 in FIG. 1), which may be enabled to increase the resolution of the Nyquist DAC.

While the present technology has been described in terms of specific implementations and configurations, further modifications, variations, modifications and refinements may be made without departing from the inventive concepts presented herein. The scope of the exclusive right sought by the Applicant(s) is therefore intended to be limited solely by the appended claims.

What is claimed is:

1. A digital-to-analog converter (DAC) comprising:
a data input for receiving a digital value;
a current source comprising an array of current source elements, the array of current source elements for producing an analog value;
a current source selector for selectively activating at least one of the current source element in the current source based on the digital value;
a gradient correction module for generating a correction term based on a model of gradient error, the correction term being applied to the data input or being combined with the analog value produced by the current source; and
a data output for outputting the analog value corresponding to the digital value.

2. The DAC according to claim 1, wherein the model of the gradient error is based on a vertical gradient error.

3. The DAC according to claim 2, wherein the vertical gradient error is modelled using a second-order polynomial.

4. The DAC according to claim 1, wherein the current source selector comprises a binary coded part and a thermometer coded part.

5. The DAC according to claim 4, wherein the model of the gradient error is a second-order polynomial based on a vertical gradient error, the second-order polynomial expressed as $I_{Off}=c_2(d_{in}-d_{mid})^2+c_1(d_{in}-d_{mid})$, wherein $d_{in}$ represents the digital input into the thermometer coded part, $d_{mid}$ represents the digital input corresponding to the row in the thermometer coded part of the array around which the vertical gradient error is centered and $I_{Off}$ represents the deviation of the data output from an ideal output.

6. The DAC according to claim 5, wherein the correction term is the value of $d_{corr}$ as defined by $d_{corr}+c_2((d_{in}+d_{corr})-d_{mid})^2+c_1((d_{in}+d_{corr})-d_{mid})=0$.

7. The DAC according to claim 5, wherein the correction term is $d_{corr}=-c_2(d_{in}-d_{mid})^2-c_1(d_{in}-d_{mid})$.

8. The DAC according to claim 1, wherein the current source comprises an array of switched current cells, switched-capacitor current source or resistor string current source, or a combination thereof.

9. The DAC according to claim 1, wherein the current source selector comprises a fully binary coded circuit.

10. The DAC according to claim 1, further comprising:
a second current source comprising at least one current source element, the at least one current source element for producing a time-dithered output that averages to an analog value less than least-significant bit (LSB) size of the DAC; and
a time-dithered selector for selectively activating the at least one current source element in the second current source to produce the time-dithered output when enabled.

11. The DAC according to claim 10, wherein the time-dithered selector generates a time-dithered sequence using a sigma-delta modulator, or a pulse-width modulator, or both.

12. A method for providing analog values comprising:
receiving, at an integrated circuit, a digital data input;
converting the digital data input to an analog output;
applying a test codeword to the digital data input;
outputting the analog value corresponding to the digital value;
measuring the analog output based on the applied test codeword; and
generating a correction term based on a model of gradient error, the correction term being applied to the digital data input or being combined with the analog output.

13. The method according to claim 12, wherein the generating a correction term comprises finding a best-fit gradient model polynomial for the measured analog output.

14. A digital-to-analog converter (DAC) comprising:
a data input for receiving a digital value;
a Nyquist DAC having a first current source including an array of current source elements, the array of current source elements for producing an analog value, and current source selector for selectively activating at least one of the current source element in the first current source based on the digital value;
an oversampled DAC having a second current source including at least one current source element, the at least one current source element for producing a time-dithered output that averages to an analog value less than least-significant bit (LSB) size of the Nyquist DAC, and a time-dithered selector for selectively activating the at least one current source element in the second current source to produce the time-dithered output when the oversampled DAC is enabled; and
a data output for outputting an analog value corresponding to the digital value by combining the analog value from the Nyquist DAC and the analog value from the oversampled DAC when enabled.

15. The DAC according to claim 14, wherein the first current source and the second current source are arranged into an M×N array of current source elements, wherein M is the number of rows in the array and N is the number of columns in the array.

16. The DAC according to claim 14, wherein the time-dithered selector generates a time-dithered sequence using a sigma-delta modulator, or a pulse-width modulator, or both.

17. The DAC according to claim 14, wherein the first current source comprises an array of switched current cells, switched-capacitor current source or resistor string current source, or a combination thereof.

18. The DAC according to claim 14, wherein the second current source comprises an array of switched current cells, switched-capacitor current source or resistor string current source, or a combination thereof.

19. The DAC according to claim 14, further comprising a second Nyquist DAC for generating a DC offset compensation, the DC offset compensation being used to compensate for a DC offset present in the Nyquist DAC.

* * * * *